(12) United States Patent
Kim et al.

(10) Patent No.: US 8,462,145 B2
(45) Date of Patent: Jun. 11, 2013

(54) DIGITAL-TO-ANALOG CONVERTER, SOURCE DRIVING CIRCUIT AND DISPLAY DEVICE HAVING THE SAME

(75) Inventors: Hyoung-Rae Kim, Hwseong-si (KR); Yong-Joon Jeon, Daejeon (KR); Gyu-Hyeong Cho, Gongju-si (KR); Sung-Woo Lee, Masan-si (KR); Hyung-Min Lee, Daegu (KR); Yoon-Kyung Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 767 days.

(21) Appl. No.: 12/639,117

(22) Filed: Dec. 16, 2009

(65) Prior Publication Data

US 2010/0156867 A1   Jun. 24, 2010

(30) Foreign Application Priority Data

Dec. 18, 2008 (KR) .......................... 10-2008-0129115

(51) Int. Cl.
  *G06F 3/038* (2006.01)
(52) U.S. Cl.
  USPC ........................................................ 345/208
(58) Field of Classification Search
  USPC .................... 345/208, 211, 87; 341/166, 153, 341/145, 136
  See application file for complete search history.

(56) References Cited

U.S. PATENT DOCUMENTS

| | | | | |
|---|---|---|---|---|
| 3,651,517 | A | * | 3/1972 | Kurek et al. ................... 341/136 |
| 4,064,506 | A | * | 12/1977 | Cartwright, Jr. .............. 341/135 |
| 5,227,795 | A | * | 7/1993 | Yamakido et al. ............ 341/166 |
| 5,426,641 | A | * | 6/1995 | Afrashteh et al. ............ 370/347 |
| 5,515,047 | A | * | 5/1996 | Yamakido et al. ............ 341/153 |
| 5,798,723 | A | * | 8/1998 | Fong ............................. 341/136 |
| 6,246,351 | B1 | | 6/2001 | Yilmaz |
| 6,326,913 | B1 | | 12/2001 | Chao et al. |
| 6,396,339 | B1 | * | 5/2002 | Jacobs .............................. 330/9 |
| 6,753,734 | B2 | * | 6/2004 | Arell et al. .................... 330/296 |
| 6,906,652 | B2 | * | 6/2005 | Bugeja .......................... 341/145 |
| 7,474,230 | B2 | * | 1/2009 | Blom et al. ............. 340/870.04 |
| 7,852,330 | B2 | * | 12/2010 | Kimura ......................... 345/211 |
| 7,960,997 | B2 | * | 6/2011 | Williams ................. 324/762.09 |
| 8,040,180 | B2 | * | 10/2011 | Yen et al. ........................ 330/10 |
| 8,120,558 | B2 | * | 2/2012 | Hsu et al. ........................ 345/87 |
| 2009/0224736 | A1 | * | 9/2009 | Santo et al. ................... 323/274 |

FOREIGN PATENT DOCUMENTS

JP    2006-197532    7/2006

* cited by examiner

*Primary Examiner* — Fred Tzeng
(74) *Attorney, Agent, or Firm* — Volentine & Whitt, PLLC

(57) ABSTRACT

A digital-to-analog converter includes a voltage-to-current converter, a current-mode digital-to-analog converter and an operational amplifier. The voltage-to-current converter generates a first current signal, and the current-mode digital-to-analog converter generates a second current signal. The operational amplifier modulates a drain current in response to the second current signal and generates an output signal having an offset.

11 Claims, 13 Drawing Sheets

DIGITAL-TO-ANALOG CONVERTER, SOURCE DRIVING CIRCUIT AND DISPLAY DEVICE HAVING THE SAME

CROSS-REFERENCE TO RELATED APPLICATION(S)

A claim of priority under 35 USC §119 is made to Korean Patent Application No. 2008-129115, filed Dec. 18, 2008, in the Korean Intellectual Property Office (KIPO), the disclosure of which is incorporated herein in its entirety by reference.

BACKGROUND

The embodiments relate to a digital-to-analog converter, and more particularly to a digital-to-analog converter, a source driving circuit and a display device including the digital-to-analog converter.

An active matrix liquid crystal display (AM LCD) device, which a higher contrast ratio than a passive matrix LCD device, generally includes a plurality of active elements connected to pixel electrodes arranged in a matrix. In the AM LCD device, thin film transistors (TFTs) are widely used as the active elements connected to the pixel electrodes.

In a conventional high definition LCD device exceeding 64 gray scales, a digital-to-analog converter occupies a large portion of a source driving circuit area. The conventional digital-to-analog converter is implemented with resistor strings serially connected to each other, and the occupation area of the resistor string increases as the number of digital data bits. This can result in a significant increase in the chip size of the source driving circuit.

SUMMARY

In some embodiments of the inventive concepts described herein, a digital-to-analog converter includes a voltage-to-current converter, a current-mode digital-to-analog converter and an operational amplifier. The voltage-to-current converter generates a first current signal proportional to a difference between a first voltage signal having a first voltage level and a second voltage signal having a second voltage level. The current-mode digital-to-analog converter generates a second current signal corresponding to a digital input signal in response to the digital input signal and the first current signal. The operational amplifier modulates a drain current in response to the second current signal and the second voltage signal and generates an output signal including an offset.

In some embodiments of the inventive concepts described herein, a digital-to-analog converter includes a first digital-to-analog converter and a second digital-to-analog converter. The first digital-to-analog converter performs digital-to-analog conversion on upper bits of a digital input signal to generate a first voltage signal having a first voltage level and a second voltage signal having a second voltage level. The second digital-to-analog converter generates a first current signal proportional to a difference between a magnitude of the first voltage signal and a magnitude of the second voltage signal, generates a second current signal corresponding to the digital input signal in response to lower bits of the digital input signal and the first current signal, and modulates a drain current in response to the second current signal and the second voltage signal and generate an output voltage including an offset.

In some embodiments of the inventive concepts, a source driving circuit includes a shift register, a data latch circuit and a digital-to-analog converter. The shift register generates a pulse signal based on a clock signal and an input/output control signal. The data latch circuit latches data according to a shift order of the shift register and outputs the data as digital input signals in response to a load signal. The digital-to-analog converter generates source signals corresponding to the digital input signals using a gray voltage. The digital-to-analog converter includes a first digital-to-analog converter and a second digital-to-analog converter. The first digital-to-analog converter performs digital-to-analog conversion on upper bits of a digital input signal to generate a first voltage signal having a first voltage level and a second voltage signal having a second voltage level. The second digital-to-analog converter generates a first current signal proportional to a difference between a magnitude of the first voltage signal and a magnitude of the second voltage signal, generates a second current signal corresponding to the digital input signal in response to lower bits of the digital input signal and the first current signal, and modulates a drain current in response to the second current signal and the second voltage signal and generate an output voltage including an offset.

In some embodiments of the inventive concepts described herein, a display device includes a shift register, a data latch circuit, a digital-to-analog converter and a panel. The shift register generates a pulse signal baked on a clock signal and an input/output control signal. The data latch circuit latches data according to a shift order of the shift register and outputs the data as digital input signals in response to a load signal. The digital-to-analog converter generates source signals corresponding to the digital input signals using a gray voltage. The panel operates in response to the source signals.

The digital-to-analog converter according to example embodiments performs interpolation by modulating a drain current using a current-mode digital-to-analog converter and an operational amplifier. The digital-to-analog converter is capable of occupying a relatively small area in a chip because the drain current modulation may be performed using a conventional output buffer amplifier. The source driving circuit including the digital-to-analog converter may be used to drive an LCD device of high definition and high gray scale of over 8 bits since the source driving circuit is capable of occupying a relatively small area.

BRIEF DESCRIPTION OF THE DRAWINGS

Example embodiments will be more clearly understood from the detailed description that follows, taken in conjunction with the accompanying drawings.

DESCRIPTION OF THE EMBODIMENTS

Figure 1:
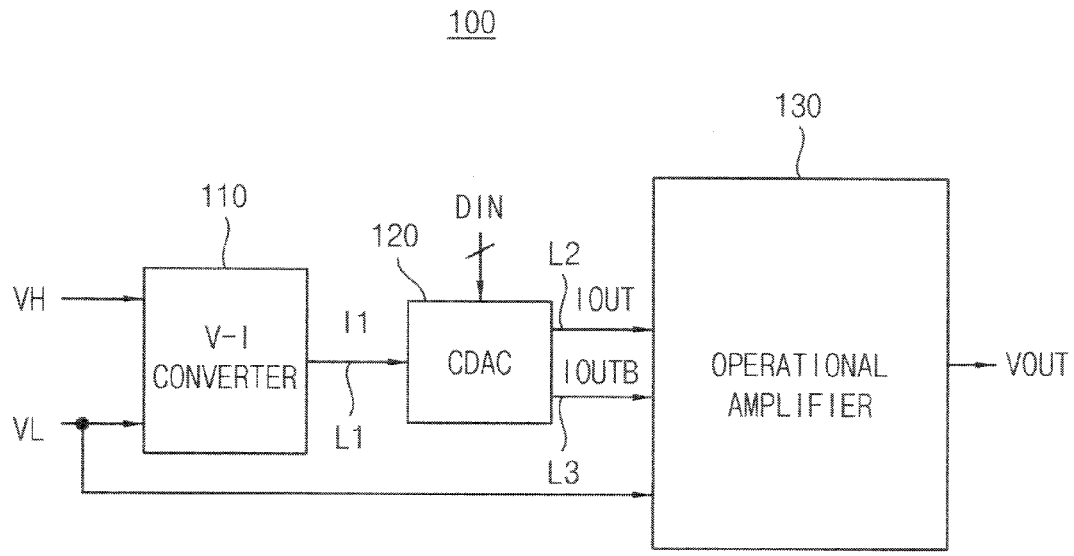
FIG. 1 is a block diagram illustrating a digital-to-analog converter according to a first example embodiment.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a digital-to-analog converter 100 according to a first example embodiment.

Referring to the example of FIG. 1, the digital-to-analog converter 100 includes a voltage-to-current converter 110, a current-mode digital-to-analog converter (CDAC) 120 and an operational amplifier 130.

The voltage-to-current converter 110 generates a first current signal I1 proportional to a difference between a first voltage signal VH having a first voltage level and a second voltage signal VL having a second voltage level. The current-mode digital-to-analog converter 120 receives the first current signal I1 through a first line L1, and generates a second current signal IOUT and a third current signal IOUTB corresponding to a digital input signal DIN in response to the digital input signal DIN and the first current signal I1. The third current signal IOUTB is a complementary signal of the second current signal IOUT. The operational amplifier 130 receives the second current signal IOUT and the third current signal IOUTB through a second line L2 and a third line L3, respectively. The operational amplifier 130 modulates a drain current and generates an output signal VOUT in response to the second current signal IOUT, the third current signal IOUTB and the second voltage signal VL. The output signal VOUT includes an offset which is explained in more detail later with reference to FIGS. 7 and 8.

Figure 2:
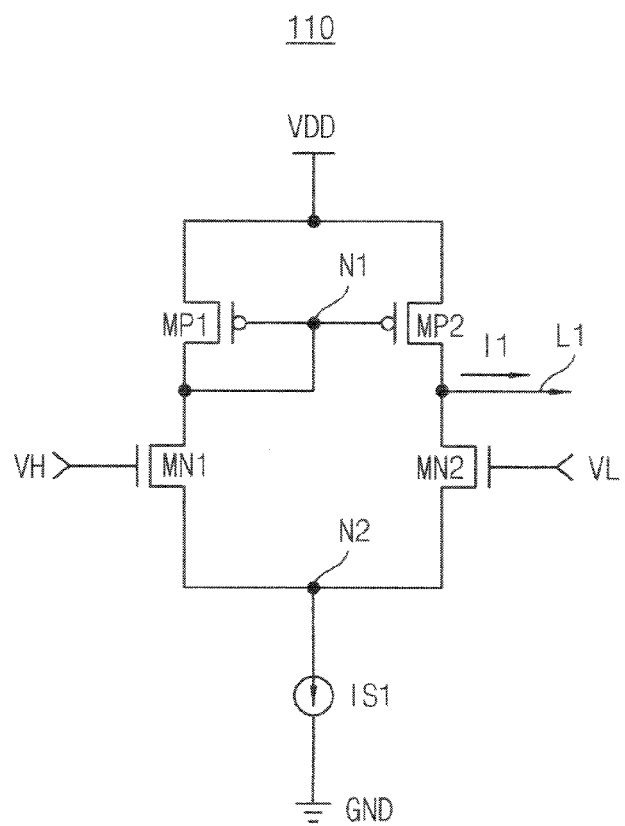
FIG. 2 is a circuit diagram illustrating an example of a voltage-to-current converter included in the digital-to-analog converter of FIG. 1.

FIG. 2 is a circuit diagram illustrating an example of a voltage-to-current converter 110 included in the digital-to-analog converter 100 of FIG. 1.

Referring to FIG. 2, the voltage-to-current converter 110 includes a first PMOS transistor MP1, a second PMOS transistor MP2, a first NMOS transistor MN1, a second NMOS transistor MN2, and a first current source IS1.

The first PMOS transistor MP1 has a source connected to a power supply voltage VDD, and a gate and a drain commonly connected to a first node N1. The second PMOS transistor MP2 has a source connected to the power supply voltage VDD, a gate connected the first node N1, and a drain connected to the first line L1. The first NMOS transistor MN1 has a drain connected to the first node N1, a gate to which the first voltage signal VH is applied and a source connected to a second node N2. The second NMOS transistor MN2 has a drain connected to the first line L1, a gate to which the second voltage signal VL is applied and a source connected to the second node N2. The first current source IS1 is coupled between the second node N2 and the ground GND.

The voltage-to-current converter 110 shown in FIG. 2 is a differential amplifier that amplifies a difference between the first voltage signal VH and the second voltage signal VL to generate the first current signal I1, and outputs the first current signal I1 to the first line L1.

As will be mentioned later, the voltage-to-current converter 110 may have the same structure as a differential input part of the operational amplifier 130.

When the transconductance of the first NMOS transistor MN1 and the second NMOS transistor MN2 is gm1, the first current signal I1 may be represented by Expression 1.

$$I1 = 2gm1 * (VH - VL) \qquad \text{Expression 1}$$

Figure 3:
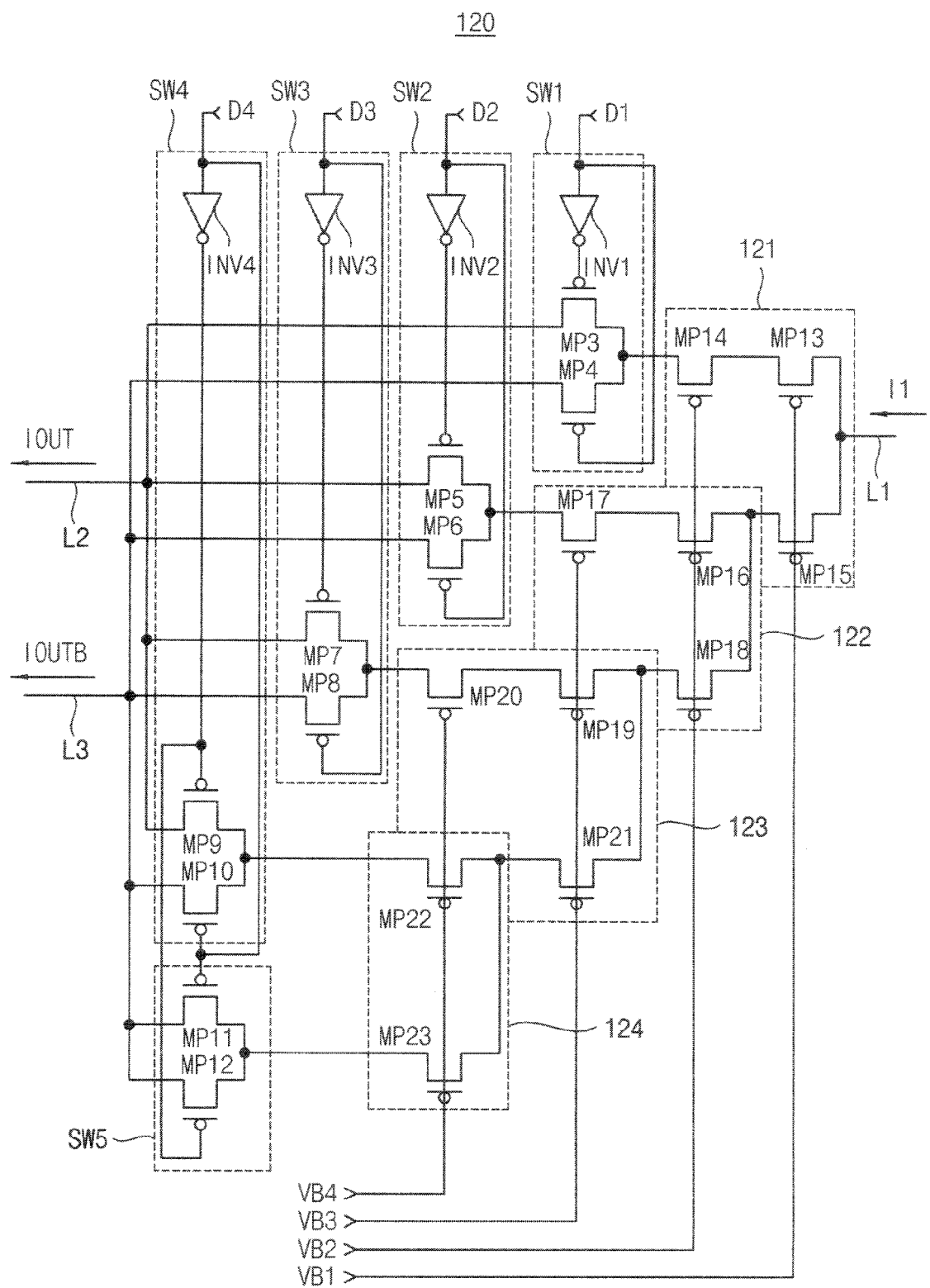
FIG. 3 is a circuit diagram illustrating an example of a current-mode digital-to-analog converter included in the digital-to-analog converter of FIG. 1.

FIG. 3 is a circuit diagram illustrating an example of the current-mode digital-to-analog converter 120 included in the digital-to-analog converter 100 of FIG. 1.

Referring to FIG. 3, the current-mode digital-to-analog converter 120 includes a first current divider 121, a second current divider 122, a third current divider 123, a fourth current divider 124, a first switching unit SW1, a second switching unit SW2, a third switching unit SW3, a fourth switching unit SW4 and a fifth switching unit SW5.

The first current divider 121 operates in response to a first bias voltage VB1 and a second bias voltage VB2, and divides the first current signal I1 from the voltage-to-current converter 110 of FIG. 1 by two. The second current divider 122 operates in response to the second bias voltage VB2 and a third bias voltage VB3, and divides an output current signal of the first current divider 121 by two. The third current divider 123 operates in response to the third bias voltage VB3 and a fourth bias voltage VB4, and divides an output current signal of the second current divider 122 by two. The fourth current divider 124 operates in response to the fourth bias voltage VB4, and divides an output current signal of the third current divider 123 by two.

The first switching unit SW1 operates in response to a first bit D1 of the digital input signal DIN and outputs an output current signal of the first current divider 121 to the second line L2 or the third line L3. The second switching unit SW2 operates in response to a second bit D2 of the digital input signal DIN and outputs an output current signal of the second current divider 122 to the second line L2 or the third line L3. The third switching unit SW3 operates in response to a third bit D3 of the digital input signal DIN and outputs an output current signal of the third current divider 123 to the second line L2 or the third line L3. The fourth switching unit SW4 operates in response to a fourth bit D4 of the digital input signal DIN and outputs an output current signal of the fourth current divider 124 to the second line L2 or the third line L3. The fifth switching unit SW5 operates in response to a fourth bit D4 of the digital input signal DIN. The fifth switching unit SW5 outputs the output current signal of the fourth current divider 124 to the third line L3 regardless of a logic state of the fourth bit D4 of the digital input signal DIN.

In the current-mode digital-to-analog converter 120 of FIG. 3, second current signal IOUT flows through the second line L2 and the third current signal IOUTB flows through the third line L3.

The first switching unit SW1 includes a first inverter INV1, a third PMOS transistor MP3 and a fourth PMOS transistor MP4. The first inverter INV1 inverts a logic state of the first bit D1 of the digital input signal DIN. The third PMOS transistor MP3 operates in response to an output signal of the first inverter INV1, and the fourth PMOS transistor MP4 operates in response to the first bit D1 of the digital input signal DIN.

When the first bit D1 of the digital input signal DIN has a logic high state, the third PMOS transistor MP3 is turned on and the fourth PMOS transistor MP4 is turned off. Therefore, the first switching unit SW1 outputs the output current signal of the first current divider 121 through the second line L2 as the second current signal IOUT. When the first bit D1 of the digital input signal DIN has a logic low state, the third PMOS transistor MP3 is turned off and the fourth PMOS transistor MP4 is turned on. Therefore, the first switching unit SW1 outputs the output current signal of the first current divider 121 through the third line L3 as the third current signal IOUTB.

The second switching unit SW2 includes a second inverter INV2, a fifth PMOS transistor MP5 and a sixth PMOS transistor MP6. The second inverter INV2 inverts a logic state of the second bit D2 of the digital input signal DIN. The fifth PMOS transistor MP5 operates in response to an output signal of the second inverter INV2, and the sixth PMOS transistor MP6 operates in response to the second bit D2 of the digital input signal DIN.

When the second bit D2 of the digital input signal DIN has a logic high state, the fifth PMOS transistor MP5 is turned on and the sixth PMOS transistor MP6 is turned off. Therefore, the second switching unit SW2 outputs the output current signal of the second current divider 122 through the second line L2 as the second current signal IOUT. When the second bit D2 of the digital input signal DIN has a logic low state, the fifth PMOS transistor MP5 is turned off and the sixth PMOS transistor MP6 is turned on. Therefore, the second switching unit SW2 outputs the output current signal of the second current divider 122 through the third line L3 as the third current signal IOUTB.

The third switching unit SW3 includes a third inverter INV3, a seventh PMOS transistor MP7 and an eighth PMOS transistor MP8. The third inverter INV3 inverts a logic state of the third bit D3 of the digital input signal DIN. The seventh PMOS transistor MP7 operates in response to an output signal of the third inverter INV3, and the eighth PMOS transistor MP8 operates in response to the third bit D3 of the digital input signal DIN.

When the third bit D3 of the digital input signal DIN has a logic high state, the seventh PMOS transistor MP7 is turned on and the eighth PMOS transistor MP8 is turned off. Therefore, the third switching unit SW3 outputs the output current signal of the third current to divider 123 through the second line L2 as the second current signal IOUT. When the third bit D3 of the digital input signal DIN has a logic low state, the seventh PMOS transistor MP7 is turned off and the eighth PMOS transistor MP8 is turned on. Therefore, the third switching unit SW3 outputs the output current signal of the third current divider 123 through the third line L3 as the third current signal IOUTB.

The fourth switching unit SW4 includes a fourth inverter INV4, a ninth PMOS transistor MP9 and a tenth PMOS transistor MP10. The fourth inverter INV4 inverts a logic state of the fourth bit D4 of the digital input signal DIN. The ninth PMOS transistor MP9 operates in response to an output signal of the fourth inverter INV4, and the tenth PMOS transistor MP10 operates in response to the fourth bit D4 of the digital input, signal DIN.

When the fourth bit D4 of the digital input signal DIN has a logic high state, the ninth PMOS transistor MP9 is turned on and the tenth PMOS transistor MP10 is turned off. Therefore, the fourth switching unit SW4 outputs the output current signal of the fourth current divider 124 through the second line L2 as the second current signal IOUT. When the fourth bit D4 of the digital input signal DIN has a logic low state, the ninth PMOS transistor MP9 is turned off and the tenth PMOS transistor MP10 is turned on. Therefore, the fourth switching unit SW4 outputs the output current signal of the fourth current divider 124 through the third line L3 as the third current signal IOUTB.

The fifth switching unit SW5 includes an eleventh PMOS transistor MP11 and a twelfth PMOS transistor MP12. The eleventh PMOS transistor MP11 operates in response to the fourth bit D4 of the digital input signal DIN, and the twelfth PMOS transistor MP12 operates in response to the output signal of the fourth inverter INV4.

When the fourth bit D4 of the digital input signal DIN has a logic high state, the eleventh PMOS transistor MPH is turned off and the twelfth PMOS transistor MP12 is turned on. Therefore, the fifth switching unit SW5 outputs the output current signal of the fourth current divider 124 through the third line L3 as the third current signal IOUTB. When the fourth bit D4 of the digital input signal DIN has a logic low state, the eleventh PMOS transistor MP11 is turned on and the twelfth PMOS transistor MP12 is turned off. Therefore, the fifth switching unit SW5 outputs the output current signal of the fourth current divider 124 through the third line L3 as the third current signal IOUTB. The fifth switching unit SW5 outputs the output current signal of the fourth current divider 124 through the third line L3 regardless of a logic state of the fourth bit D4 of the digital input signal DIN because a drain of the eleventh PMOS transistor MP11 and a drain of the twelfth PMOS transistor MP12 are commonly connected to the third line L3.

The first current divider 121 includes a thirteenth PMOS transistor MP13, a fourteenth PMOS transistor MP14 and a fifteenth PMOS transistor MP15. The thirteenth PMOS transistor MP13 and the fifteenth PMOS transistor MP15 are connected in a current mirror form, and a current having one half of a magnitude of the first current signal I1 flows through each of the thirteenth PMOS transistor MP13 and the fifteenth PMOS transistor MP15. The current flowing through the thirteenth PMOS transistor MP13 flows through the fourteenth PMOS transistor MP14, and a drain current of the fourteenth PMOS transistor MP14 is an output current signal of the first current divider 121.

The second current divider 122 includes a sixteenth PMOS transistor MP16, a seventeenth PMOS transistor MP17 and an eighteenth PMOS transistor MP18. The sixteenth PMOS transistor MP16 and the eighteenth PMOS transistor MP18 are connected in a current mirror form, and a gate of the sixteenth PMOS transistor MP16 and a gate of the eighteenth PMOS transistor MP18 are commonly connected to a gate of the fourteenth PMOS transistor MP14. The current having one half of a magnitude of a drain current of the fifteenth PMOS transistor MP15 flows through each of the sixteenth PMOS transistor MP16 and the eighteenth PMOS transistor MP18. The current flowing through the sixteenth PMOS transistor MP16 flows through the seventeenth PMOS transistor MP17, and a drain current of the seventeenth PMOS transistor MP17 is an output current signal of the second current divider 122.

The third current divider 123 includes a nineteenth PMOS transistor MP19, a twentieth PMOS transistor MP20 and a twenty-first PMOS transistor MP21. The nineteenth PMOS transistor MP19 and the twenty-first PMOS transistor MP21 are connected in a current mirror form, and a gate of the nineteenth PMOS transistor MP19 and a gate of the twenty-first PMOS transistor MP21 are commonly connected to a gate of the seventeenth PMOS transistor MP17. The current having one half of a magnitude of a drain current of the eighteenth PMOS transistor MP18 flows through each of the nineteenth PMOS transistor MP19 and the twenty-first PMOS transistor MP21. The current flowing through the nineteenth PMOS transistor MP19 flows through the twentieth PMOS transistor MP20, and a drain current of the twentieth PMOS transistor MP20 is an output current signal of the third current divider 123.

The fourth current divider 124 includes a twenty-second PMOS transistor MP22 and a twenty-third PMOS transistor MP23. The twenty-second PMOS transistor MP22 and the twenty-third PMOS transistor MP23 are connected in a current mirror form, and a gate of the twenty-second PMOS transistor MP22 and a gate of the twenty-third PMOS transistor MP23 are commonly connected to a gate of the twenty-first PMOS transistor MP21. The current having one half of a magnitude of a drain current of the twenty-first PMOS transistor MP21 flows through each of the twenty-second PMOS transistor MP22 and the twenty-third PMOS transistor MP23. The drain current of the twenty-second PMOS transistor MP22 or the drain current of the twenty-third PMOS transistor MP23 is an output current signal of the fourth current divider 124.

Bias voltages VB1, VB2, VB3 and VB4 are set with appropriate values so that PMOS transistors in the firth to fourth current divider 121, 122, 123 and 124 may operate in a saturation region.

Hereinafter, the operation of the current-mode digital-to-analog converter 120 shown in FIG. 3 will be described.

The current-mode digital-to-analog converter 120 of FIG. 3 is constructed with PMOS transistors, and is a digital-to-analog converter of a source type that converts the digital input signal DIN having four bits D1, D2, D3 and D4 into sixteen analog signals.

The current-mode digital-to-analog converter 120 generates the second current signal TOUT and the third current signal IOUTB corresponding to the digital input signal DIN in response, to the bits D1, D2, D3 and D4 of the digital input signal DIN and the first current signal I1. The third current signal IOUTB is a complementary signal of the second current signal IOUT. The first current signal I1 is generated by the voltage-to-current converter 110 of FIG. 1, and is an amplified signal corresponding to the difference between the first voltage signal VH and the second voltage signal VL.

A drain current of the fourteenth PMOS transistor MP14 is the output current signal of the first current divider 121, a drain current of the seventeenth PMOS transistor MP17 is the output current signal of the second current divider 122, a drain current of the twentieth PMOS transistor MP20 is the output current signal of the third current divider 123, and a drain current of the twenty-second PMOS transistor MP22 or a drain current of the twenty-third PMOS transistor MP23 is the output current signal of the fourth current divider 124.

The output current signal of the first current divider 121 has one half of a magnitude of the first current signal I1, the output current signal of the second current divider 122 has one half of a magnitude of the output signal of the first current divider 121, the output current signal of the third current divider 123 has one half of a magnitude of the output signal of the second current divider 122, and the output current signal of the fourth current divider 124 has one half of a magnitude of the output signal of the third current divider 123.

Therefore, a current corresponding to each of $2^4$ (=16) digital signals may be generated as the second current signal IOUT by turning on or off the PMOS transistors included in the first to fourth switching unit SW1, SW2, SW3 and SW4 in response to logic states of the bits D1, D2, D3 and D4 of the digital input signal DIN. The third current signal IOUTB is a complementary signal of the second current signal IOUT, and may be used as an input signal of the operational amplifier 130 in FIG. 1 in some embodiments.

Figure 4:
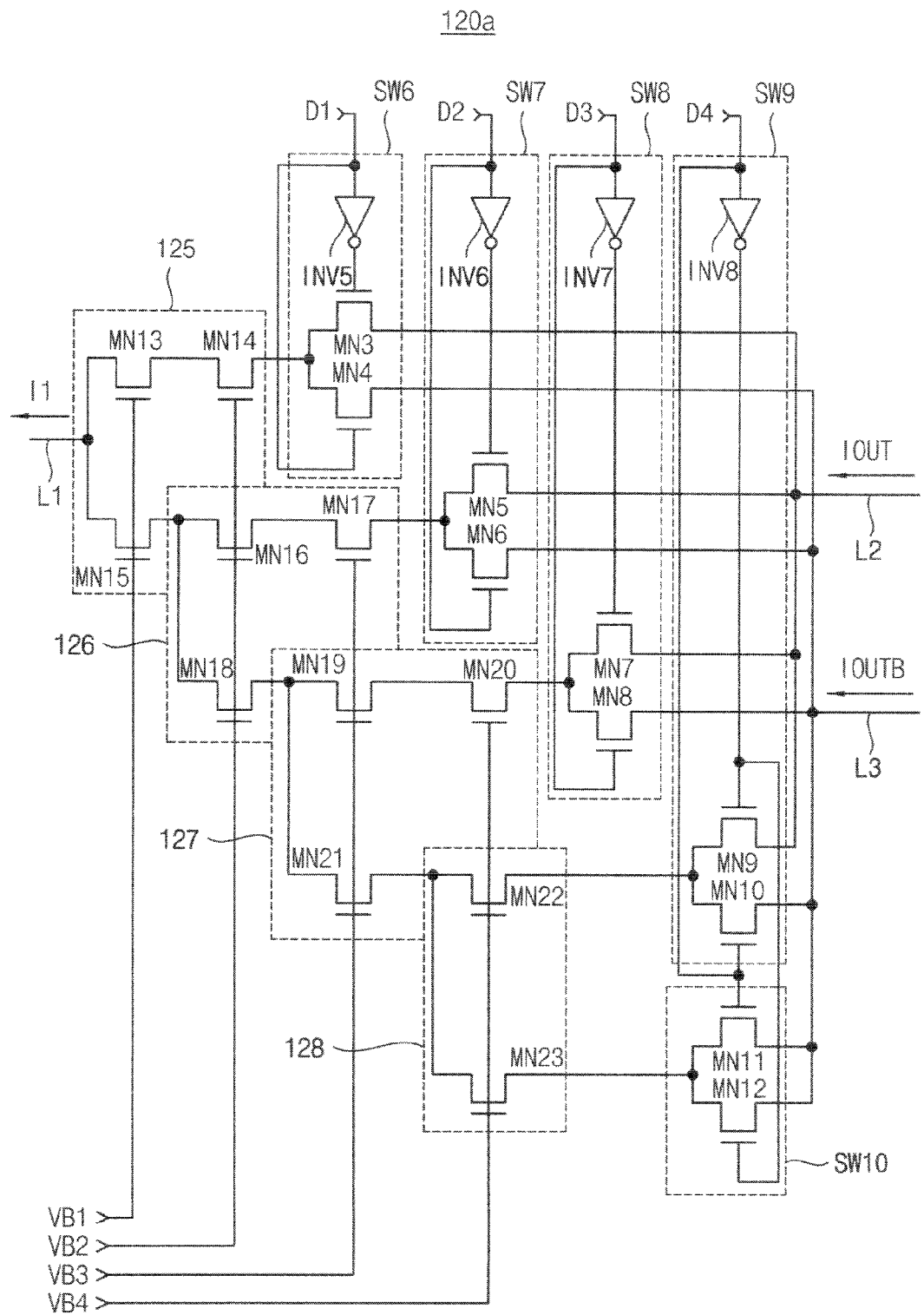
FIG. 4 is a circuit diagram illustrating another example of a current-mode digital-to-analog converter included in the digital-to-analog converter of FIG. 1.

FIG. 4 is a circuit diagram illustrating another example of a current-mode digital-to-analog converter 120 included in the digital-to-analog converter 100 of FIG. 1. The current-mode digital-to-analog converter 120a of FIG. 4 is constructed with NMOS transistors, and is a digital-to-analog converter of a sync type that converts the digital input signal DIN having four bits D1, D2, D3 and D4 into sixteen analog signals.

Referring to FIG. 4, the current-mode digital-to-analog converter 120a includes a fifth current divider 125, a sixth current divider 126, a seventh current divider 127, a eighth current divider 128, a sixth switching unit SW6, a seventh switching unit SW7, an eighth switching unit SW8, a ninth switching unit SW9 and a tenth switching unit SW10.

The fifth current divider 125 operates in response to a first bias voltage VB1 and a second bias voltage VB2, and divides the first current signal I1 from the voltage-to-current converter 110 of FIG. 1 by two. The sixth current divider 126 operates in response to the second bias voltage VB2 and a third bias voltage VB3, and divides an output current signal of the fifth current divider 125 by two. The seventh current divider 127 operates in response to the third bias voltage VB3 and a fourth bias voltage VB4, and divides an output current signal of the sixth current divider 126 by two. The eighth current divider 128 operates in response to the fourth bias voltage VB4, and divides an output current signal of the seventh current divider 127 by two.

The current-mode digital-to-analog converter 120a of FIG. 4 is constructed with NMOS transistors, and directions of the input current and output current are different from the directions of the input current and output current of the current-mode digital-to-analog converter 120 of FIG. 3. Otherwise, the current-mode digital-to-analog converter 120a of FIG. 4 operates similarly to the current-mode digital-to-analog converter 120 of FIG. 3. Therefore, a detailed description of the operation of the current-mode digital-to-analog converter 120a of FIG. 1 will be omitted here to avoid redundancy.

Figure 5:
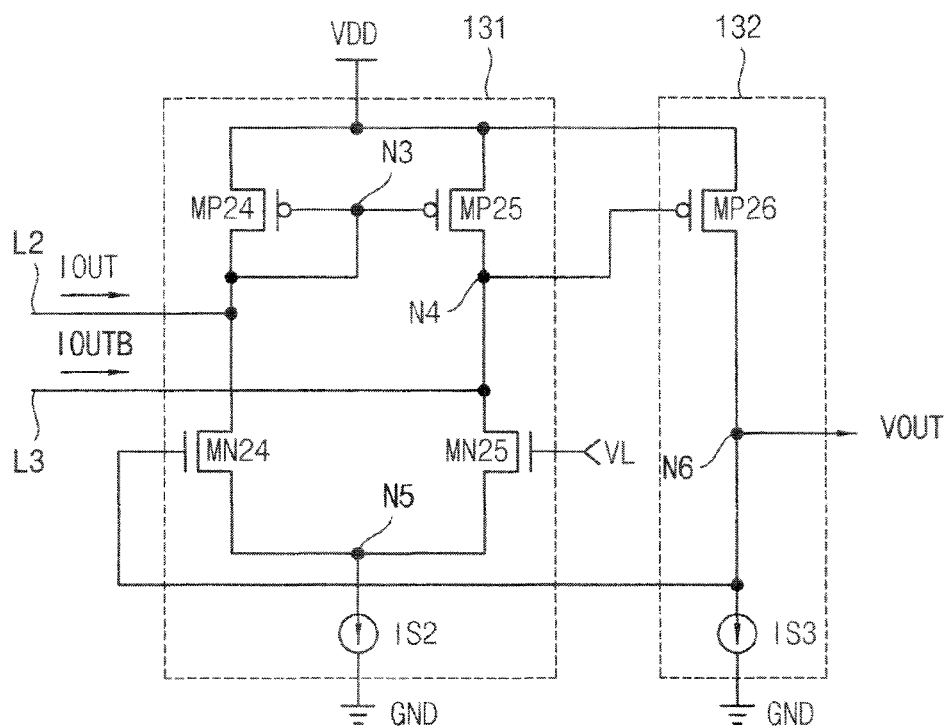
FIG. 5 is a circuit diagram illustrating an example of an operational amplifier included in the digital-to-analog converter of FIG. 1.

FIG. 5 is a circuit diagram illustrating an example of an operational amplifier 130 included in the digital-to-analog converter 100 of FIG. 1.

Referring to FIG. 5, the operational amplifier 130 includes a differential input unit 131 and a negative gain unit 132.

The differential input unit 131 modulates a drain current using the second current signal IOUT and the third current signal IOUTB, and amplifies a difference between the second voltage signal VL and the output voltage VOUT. The negative gain unit 132 amplifies an output signal of the differential input unit 131 to generate the output voltage VOUT and feedbacks the output voltage VOUT to the differential input unit 131.

The differential input unit 131 includes a twenty-fourth PMOS transistor MP24, a twenty-fifth PMOS transistor MP24, twenty-fourth NMOS transistor MN24, a twenty-fifth NMOS transistor MN24 and a second current source IS2.

The twenty-fourth PMOS transistor MP24 has a source connected to the power supply voltage VDD, a gate and drain commonly connected to a third node N3. The twenty-fifth PMOS transistor MP25 has a source connected to the power supply voltage VDD, a gate connected to the third node N3 and a drain connected to a fourth node N4. The twenty-fourth NMOS transistor MN24 has a drain connected to the third node N3, a gate to which the output voltage VOUT is applied and a source connected to a fifth node N5. The twenty-fifth NMOS transistor MN25 has a drain connected to the fourth node N4, a gate to which the second voltage signal VL is applied and a source connected to the fifth node N5. The second current source IS2 is coupled between the fifth node N5 and the ground GND. The second line L2 is coupled to the third node N3 and the third line L3 is coupled to the fourth node N4.

The negative gain unit 132 includes a twenty-sixth PMOS transistor MP26 and a third current source IS3. The third current source IS3 may be NMOS transistors connected to each other in a current mirror form. The twenty-sixth PMOS transistor MP26 has a source connected to the power supply voltage VDD, a gate connected to the fourth node N4 and a drain connected to a sixth node N6. The third current source IS3 is coupled between the sixth node N6 and the ground GND. The sixth node N6 is connected to the gate of the twenty-fourth NMOS transistor MN24.

Hereinafter, the operation of the operational amplifier 130 will be described.

When the second current signal IOUT and the third current signal IOUTB are not considered, the operational amplifier 130 operates as follows.

The negative gain unit 132 is a feedback circuit and determines a gain of the operational amplifier 130. When the magnitude of a voltage of the fourth node N4 increases, the magnitude of a voltage of the sixth node N6, that is the magnitude of the output voltage VOUT, decreases. Therefore, the negative gain unit 132 generates a negative gain. The output voltage VOUT is fed back to the gate of the twenty-fourth NMOS transistor MN24. When the magnitude of the output voltage VOUT decreases, the magnitude of a current flowing through the twenty-fourth NMOS transistor MN24 decreases, and the magnitude of a current flowing through the twenty-fifth NMOS transistor MN25 increases. Therefore, the magnitude of the voltage of the fourth node N4 decreases and the magnitude of the output voltage VOUT increases. When the magnitude of the output voltage VOUT increases, the magnitude of a current flowing through the twenty-fourth NMOS transistor MN24 increases, and the magnitude of a current flowing through the twenty-fifth NMOS transistor MN25 decreases. Therefore, the magnitude of the voltage of the fourth node N4 increases and the magnitude of the output voltage VOUT decreases.

Therefore, the operational amplifier 130 has a negative feedback circuit structure, and generates a stable output voltage VOUT having the magnitude of the second voltage signal VL without consideration of the second current signal IOUT and the third current signal IOUTB.

When the second current signal IOUT and the third current signal IOUTB are considered, the operational amplifier 130 operates as follows.

The second current signal IOUT received from the second line L2 modulates a drain current of the twenty-fourth NMOS transistor MN24, and the third current signal IOUTB received from the third line L3 modulates a drain current of the twenty-fifth NMOS transistor MN25. When the drain current modulation is generated in the operational amplifier 130, the magnitude of the output voltage VOUT is the second voltage signal VL plus an offset voltage VOUTOFFSET (i.e., VOUT=VL+VOUTOFFSET).

When the transconductance of the twenty-fourth NMOS transistor MN24 and the twenty-fifth NMOS transistor MN25 is gm1, the offset voltage VOUTOFFSET may be represented by Expression 2.

$$VOUTOFFSET = (IOUT - IOUTB)/2gm1 \qquad \text{Expression 2}$$

Comparing Expression 1 and Expression 2, it can be noted that the maximum value of the offset voltage VOUTOFFSET is VH−VL.

Therefore, the digital-to-analog converter 100 is configured, for example, to perform interpolation of a voltage between VH and VL by adjusting an amount of the second current signal IOUT and the third current signal IOUTB using the current-mode digital-to-analog converter 120, and by performing amplification using the operational amplifier 130.

Figure 6:
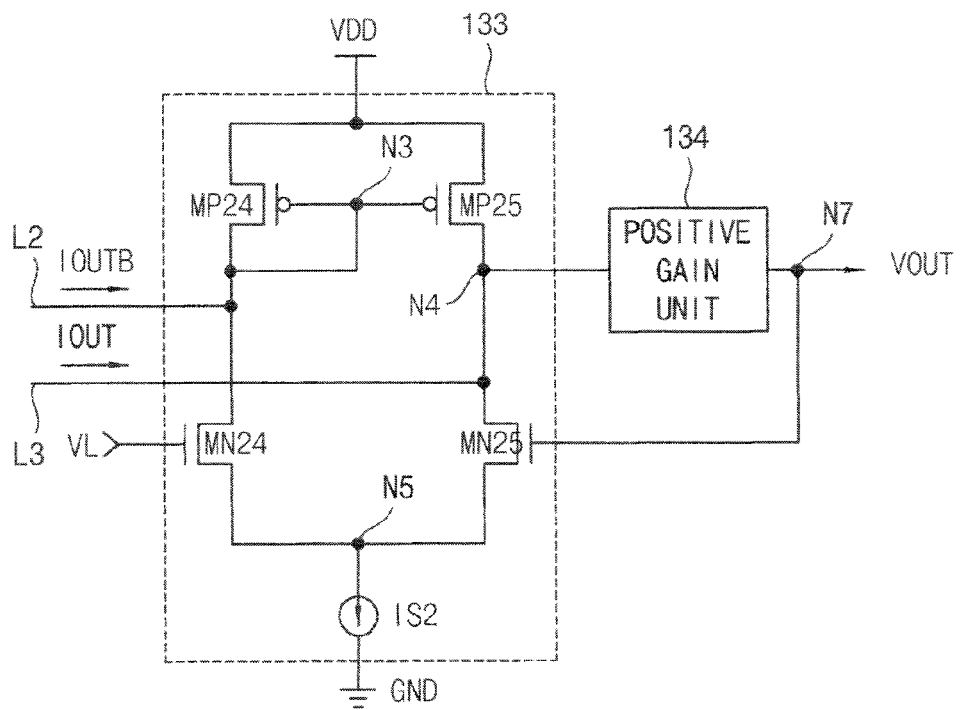
FIG. 6 is a circuit diagram illustrating another example of an operational amplifier included in the digital-to-analog converter of FIG. 1.

FIG. 6 is a circuit diagram illustrating another example of an operational amplifier 130 included in the digital-to-analog converter 100 of FIG. 1.

Referring to FIG. 6, the operational amplifier 130a includes a differential input unit 133 and a positive gain unit 134.

The differential input unit 133 modulates a drain current using the second current signal IOUT and the third current signal IOUTB, and amplifies a difference between the second voltage signal VL and the output voltage VOUT. The negative gain unit 134 amplifies an output signal of the differential input unit 133 to generate the output voltage VOUT and feedbacks the output voltage VOUT to the differential input unit 133.

The differential input unit 133 may have the same circuit structure as the circuit structure of the differential input unit 131 shown in FIG. 5. However, in the operational amplifier 130a, the output voltage VOUT is fed back to a gate of the twenty-fifth NMOS transistor MN25, the third current signal IOUTB is received from the second line L2, and the second current signal IOUT is received from the third line L3.

Hereinafter, the operation of the operational amplifier 130a of FIG. 6 will be described.

When the second current signal IOUT and the third current signal IOUTB are not considered, the operational amplifier 130a operates as follows.

The positive gain unit 134 is a feedback circuit and determines a gain of the operational amplifier 130a. When the magnitude of a voltage of the fourth node N4 increases, the magnitude of a voltage of the seventh node N7, that is the magnitude of the output voltage VOUT, increases. Therefore, the positive gain unit 134 generates a positive gain. The output voltage VOUT is fed back to the gate of the twenty-fifth NMOS transistor MN25. When the magnitude of the output voltage VOUT increases, the magnitude of a current flowing through the twenty-fifth NMOS transistor MN25 increases, and the magnitude of a current flowing through the twenty-fourth NMOS transistor MN24 decreases. Therefore, the magnitude of the voltage of the fourth node N4 decreases and the magnitude of the output voltage VOUT decreases. When the magnitude of the output voltage VOUT decreases, the magnitude of a current flowing through the twenty-fifth NMOS transistor MN24 decreases, and the magnitude of a current flowing through the twenty-fourth NMOS transistor MN24 increases. Therefore, the magnitude of the voltage of the fourth node N4 increases and the magnitude of the output voltage VOUT increases.

Therefore, the operational amplifier 130a has a positive feedback circuit structure, and generates a stable output voltage VOUT having the magnitude of the second voltage signal VL when the second current signal IOUT and the third current signal IOUTB are not considered.

When the second current signal IOUT and the third current signal IOUTB are considered, the operational amplifier 130a operates as follows.

The third current signal IOUTB received from the second line L2 modulates a drain current of the twenty-fourth NMOS transistor MN24, and the second current signal TOUT received from the third line L3 modulates a drain current of the twenty-fifth NMOS transistor MN25. When the drain current modulation is generated in the operational amplifier 130a, the magnitude of the output voltage VOUT is the second voltage signal VL added by an offset voltage VOUTOFFSET.

Therefore, the digital-to-analog converter 100 is configured, for example, to perform interpolation of a voltage between VH and VL by adjusting amount of the second current signal IOUT and the third current signal IOUTB using the current-mode digital-to-analog converter 120, and by performing amplification using the operational amplifier 130a.

Figure 7:
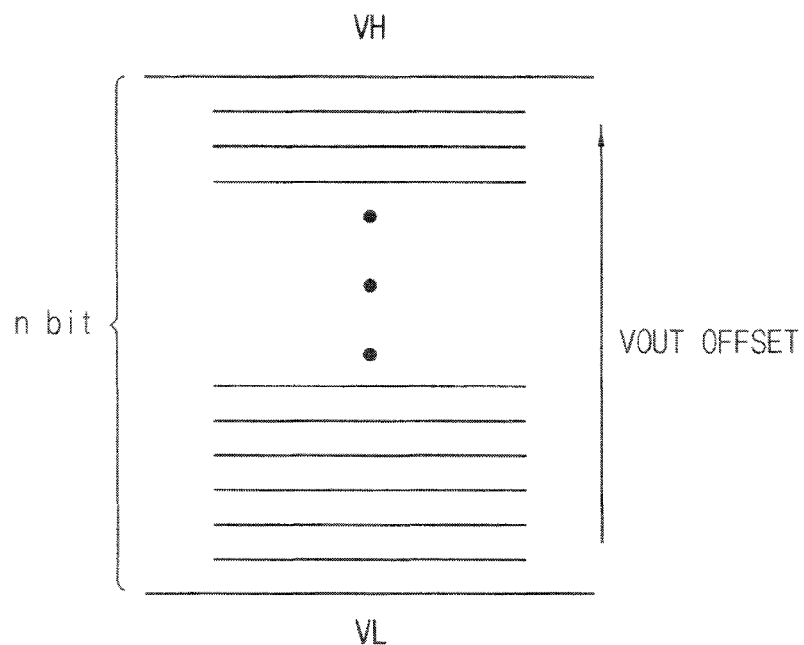
FIG. 7 and FIG. 8 are diagrams for explaining an output offset voltage of the digital-to-analog converter of FIG. 1.
Figure 8:
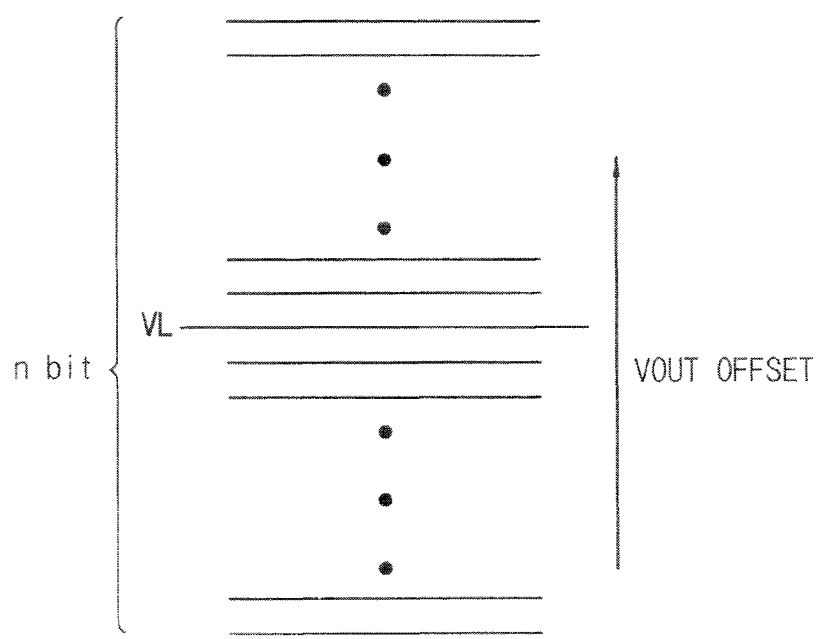

FIG. 7 and FIG. 8 are diagrams for explaining an output offset voltage VOUTOFFSET of the digital-to-analog converter 100 of FIG. 1.

FIG. 7 is representative of the range of the output offset voltage VOUT OFFSET when the digital-to-analog conversion is performed by modulating a drain current using only the second current signal IOUT. FIG. 8 is representative of the range of the output offset voltage VOUTOFFSET when the digital-to-analog conversion is performed by modulating a drain current using both the second current signal IOUT and the third current signal IOUTB.

When the digital-to-analog conversion is performed using only the second current signal IOUT, the output voltage VOUT may be the second voltage signal VL increased by the output offset voltage VOUTOFFSET, and have values from VL to VH. When the digital-to-analog conversion is performed using both the second current signal IOUT and the third current signal IOUTB, the output voltage VOUT may be the second voltage signal VL increased or decreased by the output offset voltage VOUTOFFSET in the upward direction and the downward direction, and thus have a symmetrical form with respect to VL.

Figure 9:
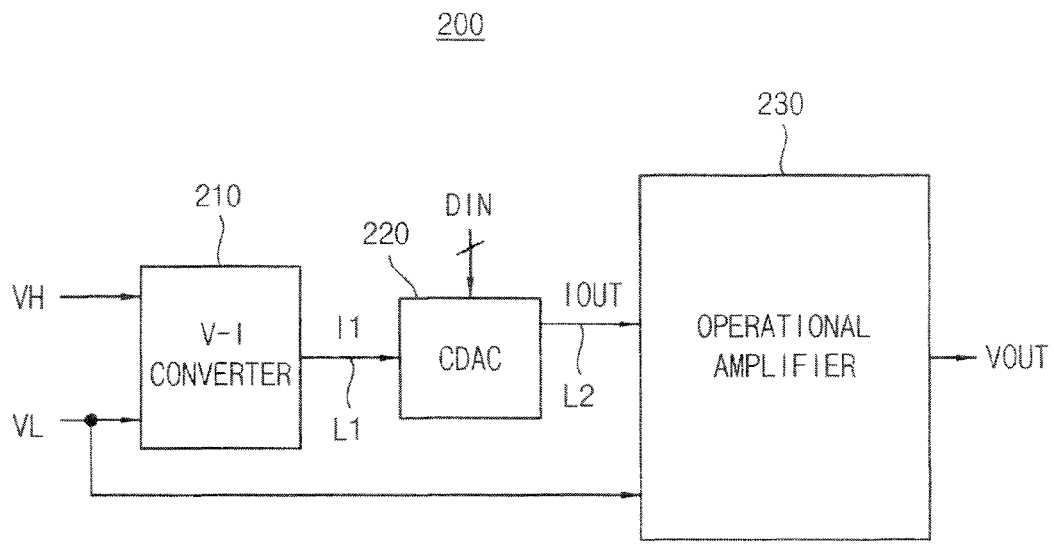
FIG. 9 is a block diagram illustrating a digital-to-analog converter according to a second example embodiment.

FIG. 9 is a block diagram illustrating a digital-to-analog converter 200 according to a second example embodiment.

Referring to the example of FIG. 9, the digital-to-analog converter 200 includes a voltage-to-current converter 210, a current-mode digital-to-analog converter (CDAC) 220 and an operational amplifier 230.

The voltage-to-current converter 210 generates a first current signal I1 proportional to a difference between a first voltage signal VH having a first voltage level and a second voltage signal VL having a second voltage level. The current-mode digital-to-analog converter 220 receives the first current signal I1 through a first line L1, and generates a second current signal IOUT corresponding to a digital input signal DIN in response to the digital input signal DIN and the first current signal I1. The operational amplifier 230 receives the second current signal IOUT through a second line L2, and modulates a drain current in response to the second current signal IOUT and the second voltage signal VL and generates an output signal VOUT which includes an offset voltage.

The digital-to-analog converter 200 of FIG. 9 performs the digital-to-analog conversion using only the second current signal IOUT, i.e., without using the third current signal IOUTB utilized in the example embodiment of FIG. 1.

Figure 10:
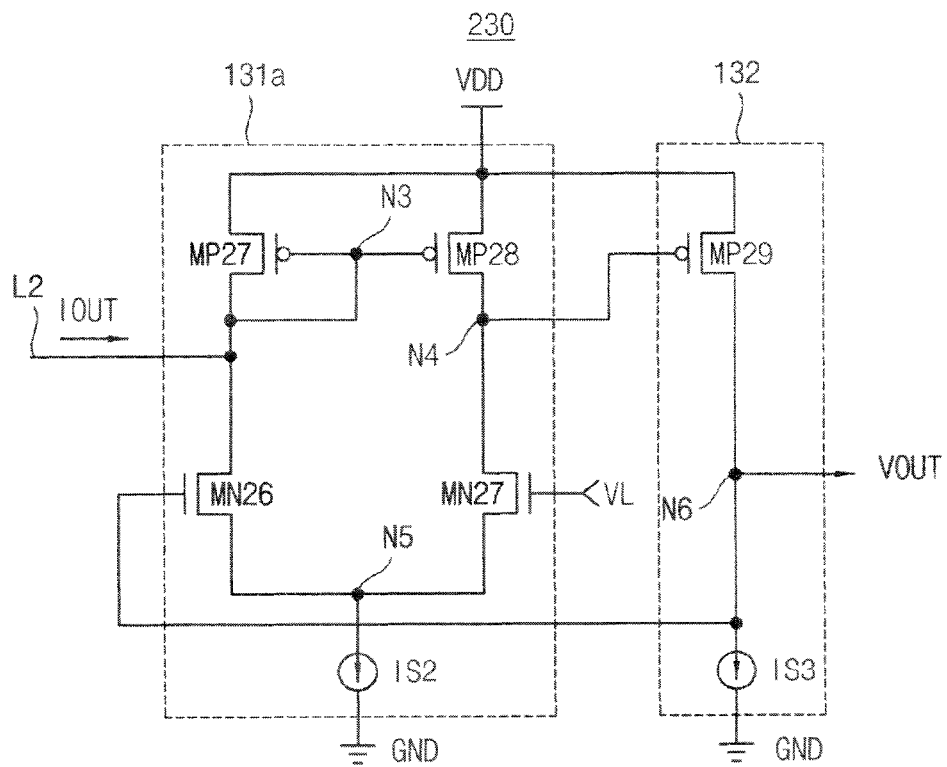
FIG. 10 is a circuit diagram illustrating an example of an operational amplifier included in the digital-to-analog converter of FIG. 9.

FIG. 10 is a circuit diagram illustrating an example of an operational amplifier 230 included in the digital-to-analog converter 200 of FIG. 9.

Referring to FIG. 10, the operational amplifier 230 includes a differential input unit 131a and a negative gain unit 132. The second line L2 is coupled to the third node N3, and the second current signal IOUT is received through the second line L2.

The operation of the operational amplifier 230 is similar to the operation of the operational amplifier 130 shown in FIG. 5, and thus a detailed operational description of the operation amplifier 230 is omitted here to avoid redundancy.

Figure 11:
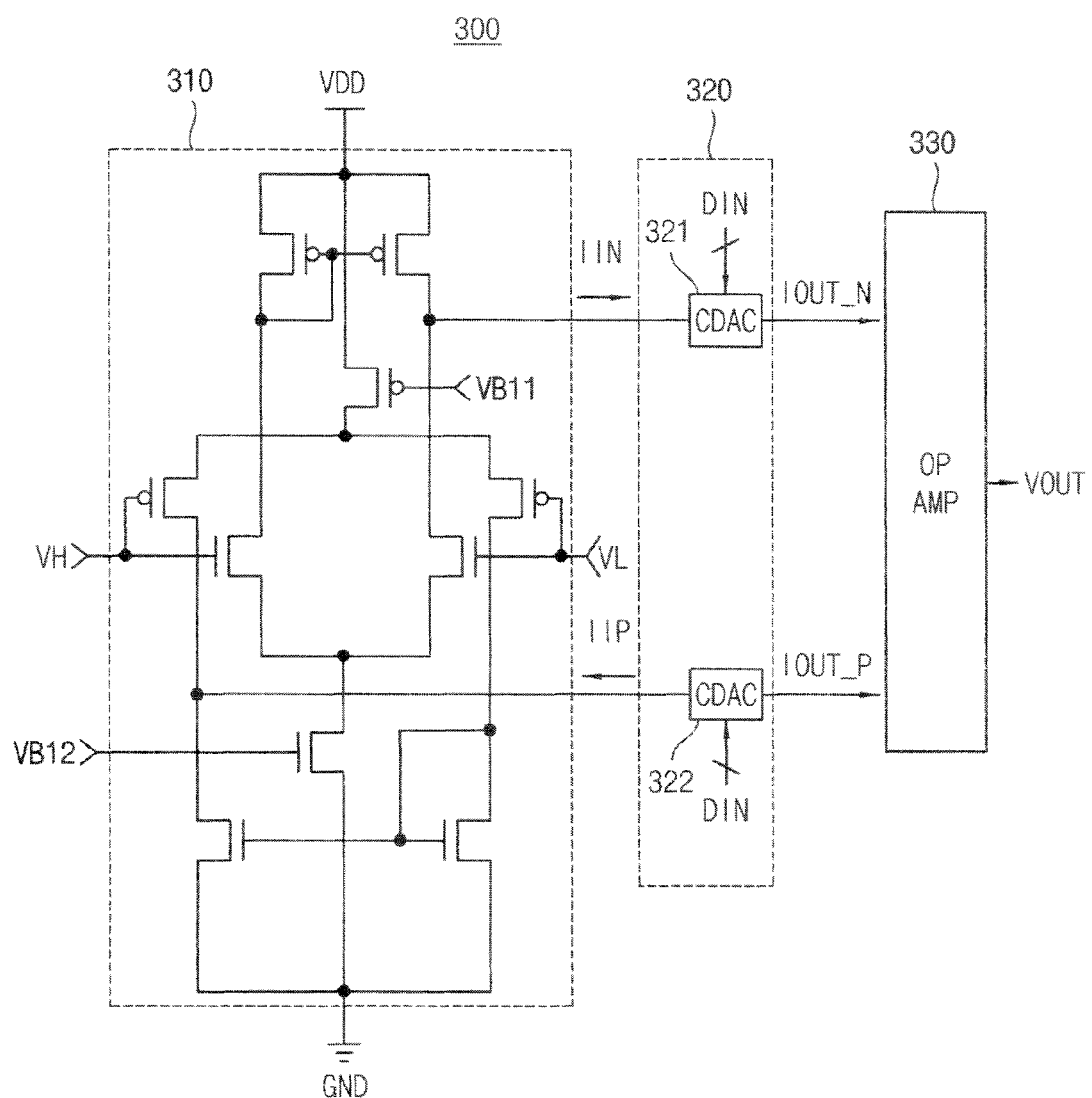
FIG. 11 is a circuit diagram illustrating a digital-to-analog converter according to a third example embodiment.
Figure 12:
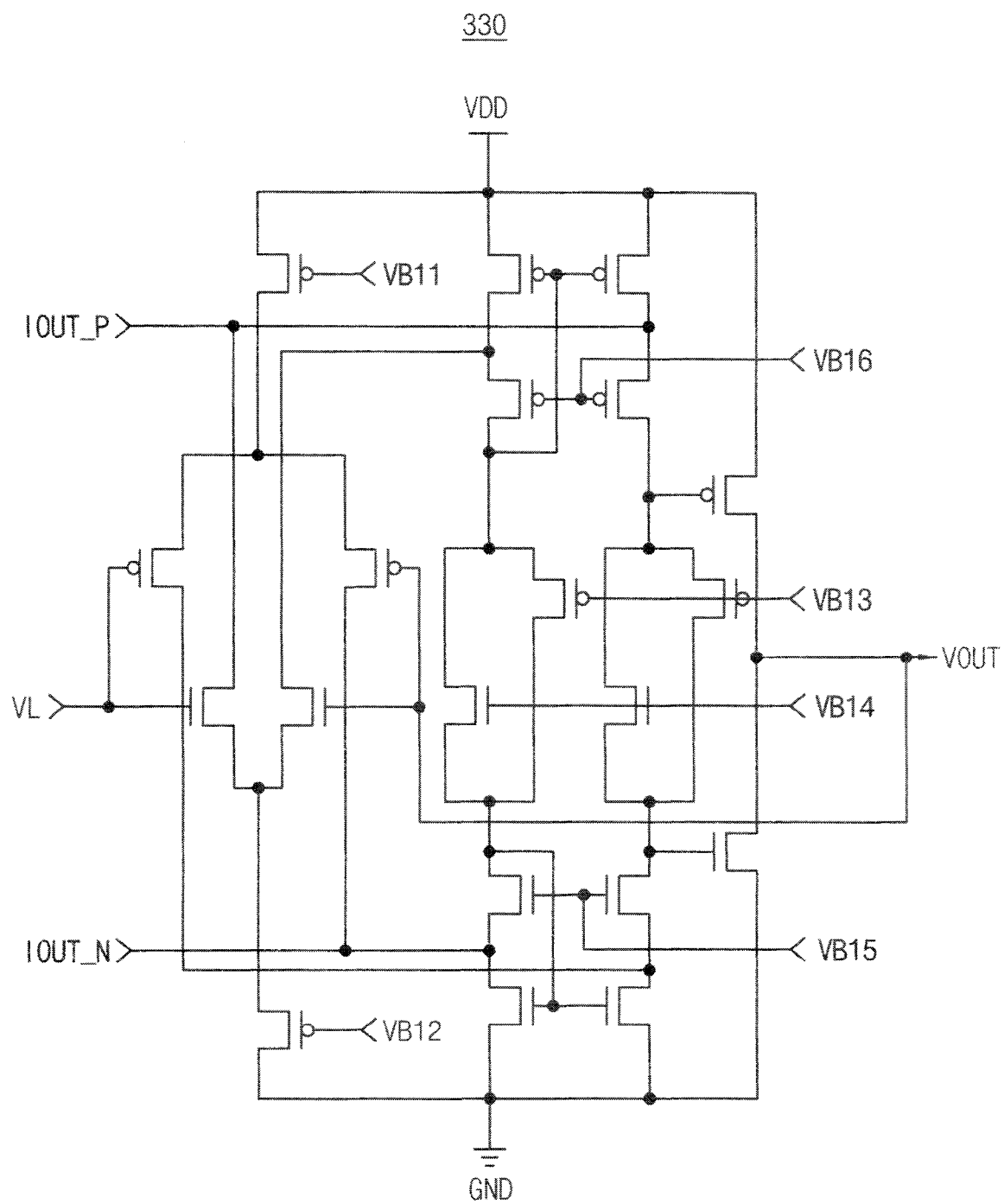
FIG. 12 is a circuit diagram illustrating an example of an operational amplifier included in the digital-to-analog converter of FIG. 11.

FIG. 11 is a circuit diagram illustrating a digital-to-analog converter 300 according to a third example embodiment, and FIG. 12 is a circuit diagram illustrating an example of an operational amplifier 330 included in the digital-to-analog converter 300 of FIG. 11.

Referring to the examples of FIG. 11 and FIG. 12, the digital-to-analog converter 300 has a structure of a rail-to-rail amplifier in which complementary metal oxide semiconductor (CMOS) transistors are used.

Referring to FIG. 11, the digital-to-analog converter 300 includes a voltage-to-current converter 310, a current-mode digital-to-analog converter (CDAC) 320 and an operational amplifier 330. The current-mode digital-to-analog converter (CDAC) 320 includes a first current-mode digital-to-analog converting unit 321 and a second current-mode digital-to-analog converting unit 322 to provide currents to a circuit portion constructed with PMOS transistors and a circuit portion constructed with NMOS transistors.

The digital-to-analog converter 300 shown in FIG. 11 has a relatively broad operating range because the digital-to-analog converter 300 has the rail-to-rail amplifier structure.

Figure 13:
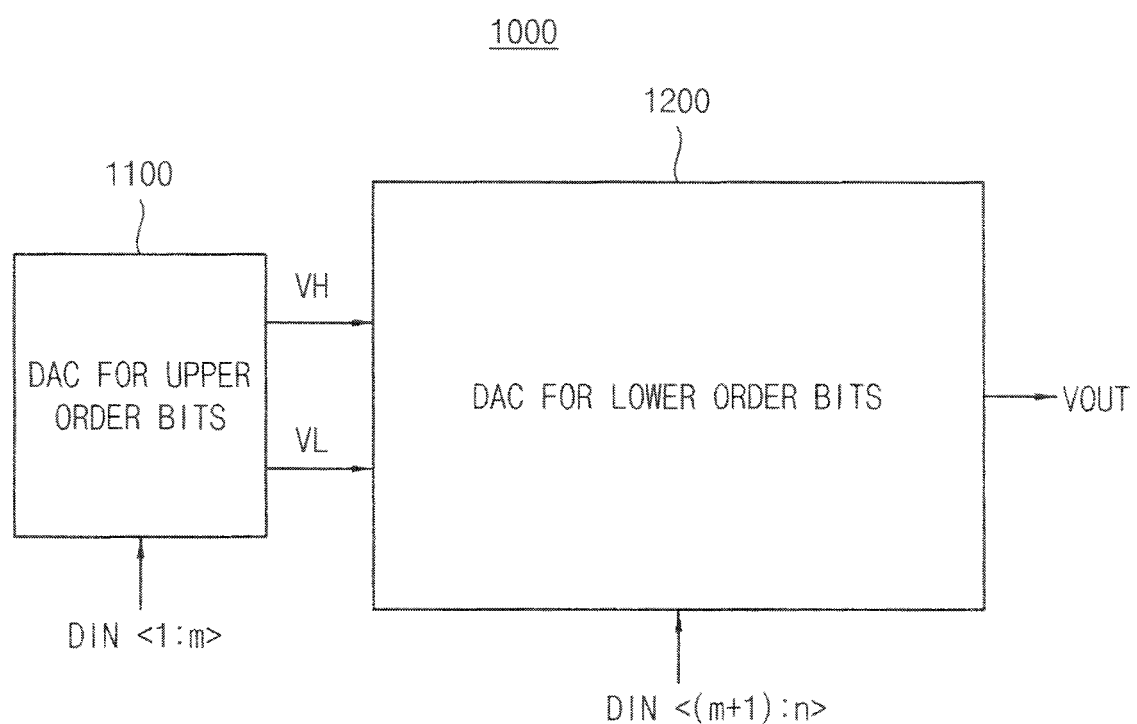
FIG. 13 is a block diagram illustrating a digital-to-analog converter according to a fourth example embodiment.

FIG. 13 is a block diagram illustrating a digital-to-analog converter according to a fourth example embodiment.

Referring to the example of FIG. 13, the digital-to-analog converter 1000 includes a first digital-to-analog converter 1100 and a second digital-to-analog converter 1200.

The first digital-to-analog converter 1100 performs digital-to-analog conversion on upper bits DIN<1:m> of a digital input signal to generate a first voltage signal VH having a first voltage level and a second voltage signal VL having a second voltage level. The second digital-to-analog converter 1200 generates a first current signal proportional to a difference between a magnitude of the first voltage signal VH and a magnitude of the second voltage signal VL, and generates a second current signal corresponding to the digital input signal in response to lower bits DIN<(m+1):n> of the digital input signal and the first current signal, and modulates a drain current in response to the second current signal and the second voltage signal and generate an output voltage VOUT having an offset.

Figure 14:
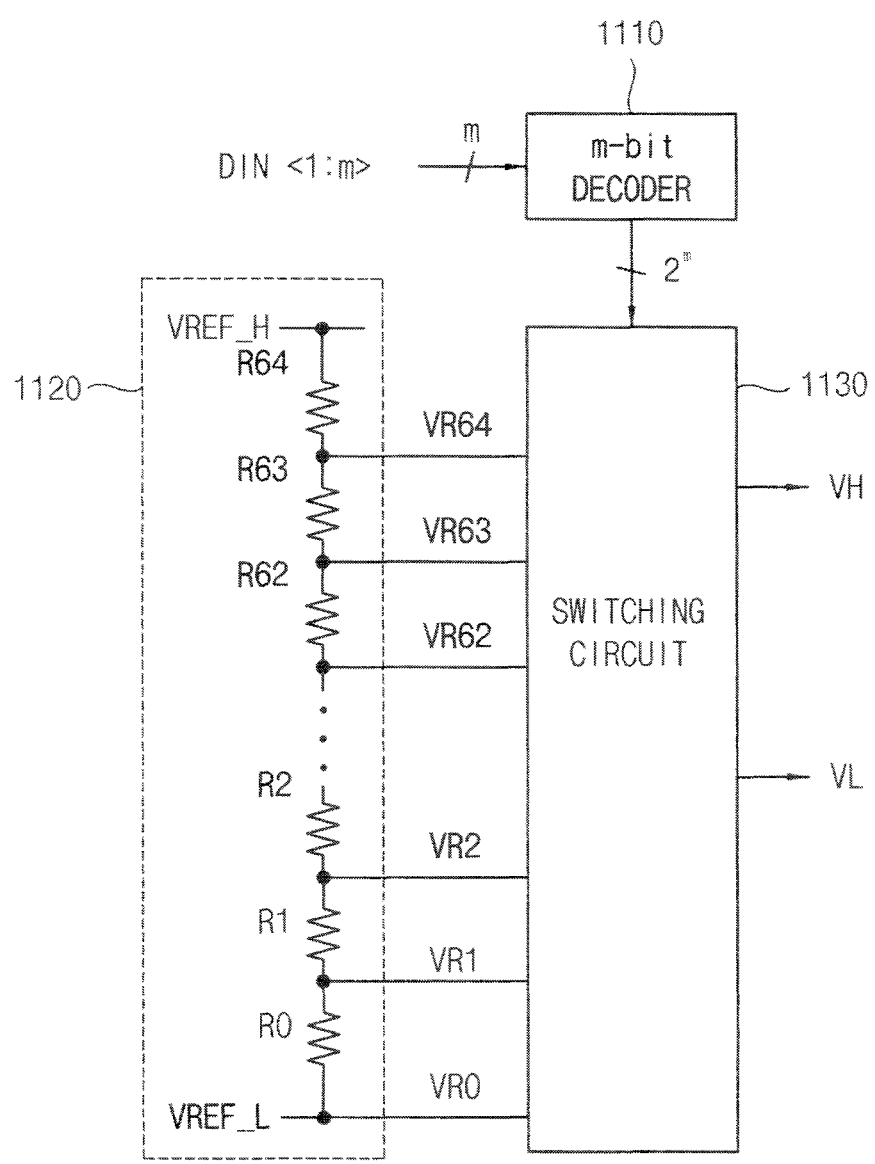
FIG. 14 is a circuit diagram illustrating an example of a first digital-to-analog converter that performs digital-analog conversion for upper bits of a digital input signal, included in the digital-to-analog converter of FIG. 13.

FIG. 14 is a circuit diagram illustrating an example of a first digital-to-analog converter 1100 that performs digital-analog converting for upper bits DIN<1:m> of a digital input signal, included in the digital-to-analog converter 1000 of FIG. 13.

Referring to the example of FIG. 14, the first digital-to-analog converter 1100 includes a decoder 1110, a resistor string 1120 and a switching circuit 1130.

The decoder 1110 performs decoding on the upper bits DIN<1:m> of a digital input signal DIN to generate $2^m$ digital signals.

The resistor string 1120 is coupled between the first reference voltage VREF_H and the second reference voltage VREF_L, and includes resistors R0 to R64 serially connected to each other, and outputs reference voltages VR0 to VR64. When the digital input signal DIN has six bits, the resistor string 1120 includes 65 ($2^6$+1) resistors, and outputs 65 reference voltages VR0 to VR64.

The switching circuit 1130 outputs two adjacent reference voltages among the reference voltages VR0 to VR64 as the first voltage signal VH and the second voltage signal VL in response to the $2^m$ digital signals.

Figure 15:
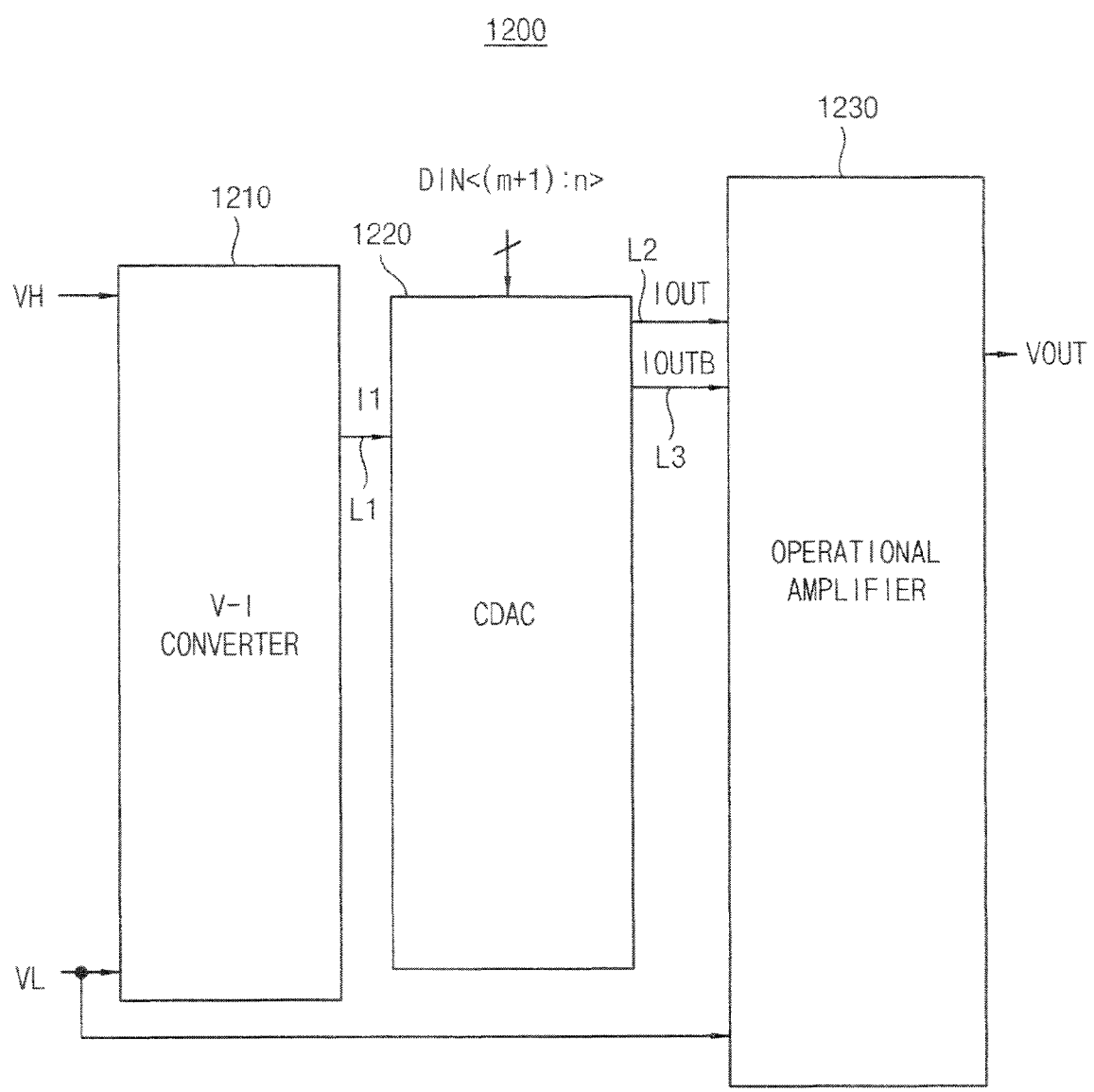
FIG. 15 is a block diagram illustrating an example of a second digital-to-analog converter that performs digital-analog conversion for lower bits of a digital input signal, included in the digital-to-analog converter of FIG. 13.

FIG. 15 is a block diagram illustrating an example of a second digital-to-analog converter that performs digital-analog converting for lower bits DIN<(m+1):n> (m, n: positive integer) of a digital input signal, included in the digital-to-analog converter 1000 of FIG. 13.

Referring to the example of FIG. 15, the second digital-to-analog converter 1200 includes a voltage-to-current converter 1210, a current-mode digital-to-analog converter (CDAC) 1220 and an operational amplifier 1230.

The voltage-to-current converter 1210 generates a first current signal I1 proportional to a difference between a first voltage signal VH having a first voltage level and a second voltage signal VL having a second voltage level. The current-mode digital-to-analog converter 1220 receives the first current signal I1 through a first line L1, and generates a second current signal IOUT and a third current signal IOUTB corresponding to a digital input signal DIN in response to the lower bits DIN<(m+1):n> of the digital input signal DIN and the first current signal I1. The third current signal IOUTB is a complementary signal of the second current signal IOUT.

The operational amplifier 1230 receives the second current signal IOUT and the third current signal IOUTB through a second line L2 and a third line L3 respectively, and modulates a drain current in response to the second current signal IOUT, the third current signal IOUTB and the second voltage signal VL and generates an output signal VOUT which includes an offset voltage.

The voltage-to-current converter 1210, the current-mode digital-to-analog converter (CDAC) 1220 and the operational amplifier 1230 may have the same structure as the voltage-to-current converter 110, the current-mode digital-to-analog converter (CDAC) 120 and the operational amplifier 130 shown in FIG. 1.

In the digital-to-analog converter 1000 of FIG. 13, the digital-to-analog conversion on the upper bits DIN<1:m> of the digital input signal DIN is performed by the first digital-to-analog converter 1100, and the digital-to-analog converting on the lower bits DIN<m+1:n> of a digital input signal DIN is performed by the second digital-to-analog converter 1200.

For example, in the case where the digital input signal DIN has 10 bits, the digital-to-analog conversion on the upper 6 bits of the digital input signal DIN is performed by the first digital-to-analog converter 1100, and 64 analog signals are output. The digital-to-analog conversion on the lower 64 bits of the digital input signal DIN is performed by the second digital-to-analog converter 1200, and 16 analog signals are output. When the digital-to-analog conversion is performed in response to output signals of the first digital-to-analog converter 1100 and the lower 4 bits of the digital input signal DIN, 1024 analog signals are output.

Therefore, the digital-to-analog converter 1000 of FIG. 13 performs 10 bit digital-to-analog conversion using the first digital-to-analog converter 1100 and the second digital-to-analog converter 1200.

Figure 16:
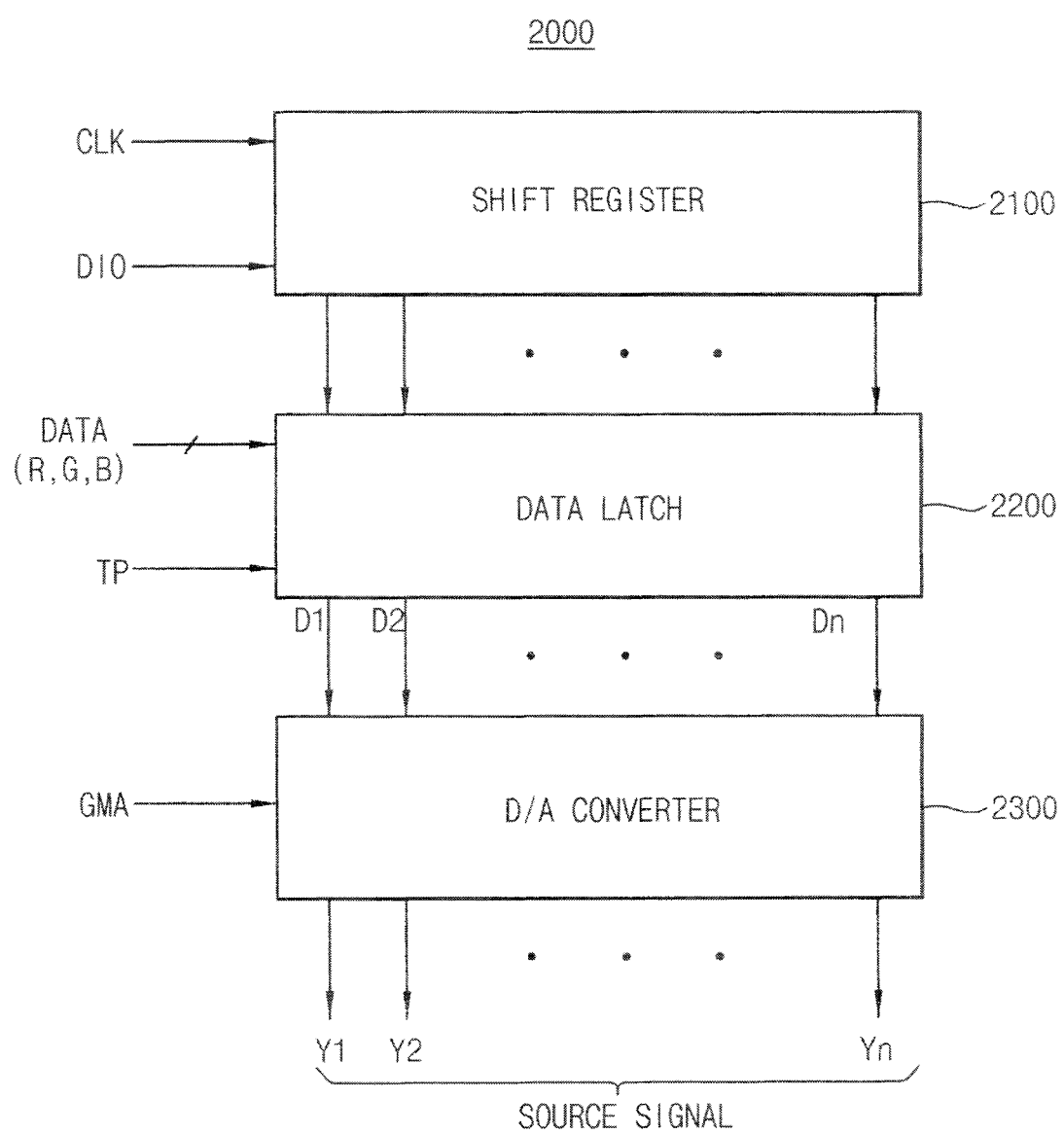
FIG. 16 is a block diagram illustrating a source driving circuit that includes a digital-to-analog converter according to example embodiments.

FIG. 16 is a block diagram illustrating a source driving circuit 2000 that includes a digital-to-analog converter according to example embodiments.

Referring to the example of FIG. 16, the source driving circuit 2000 includes a shift register 2100, a data latch circuit 2200 and a digital-to-analog converter 2300.

The shift register 2100 receives a clock signal CLK and an input/output control signal DIO, and generates a pulse signal in response to a clock signal. The data latch circuit 2200 receives data DATA and a load signal TP. The data latch circuit 2200 latches the data DATA according to a shift order of the shift register 2100 and outputs the data DATA in response to the load signal TP.

The digital-to-analog converter 2300 generates source signals Y1 to Yn, which are analog signals corresponding to output signals D1 to Dn of the data latch circuit 2200 using a gray voltage GMA. The source signals Y1 to Yn are output according to an order of the data DATA applied to the latch circuit 2200.

The digital-to-analog converter 2300 included in the source driving circuit 2000 of FIG. 16 may have the same structure of a digital-to-analog converter according to example embodiments described above. The digital-to-analog converter 2300 may modulate a drain current and generate an output signal which includes an offset voltage to perform digital-to-analog converting. Further, the digital-to-analog converter 2300 performs digital-to-analog converting on upper bits of a digital input signal using the first digital-to-analog converter having a resistor string, and performs digital-to-analog conversion on lower bits of a digital input signal using the second digital-to-analog converter having a current-mode digital-to-analog converter.

Figure 17:
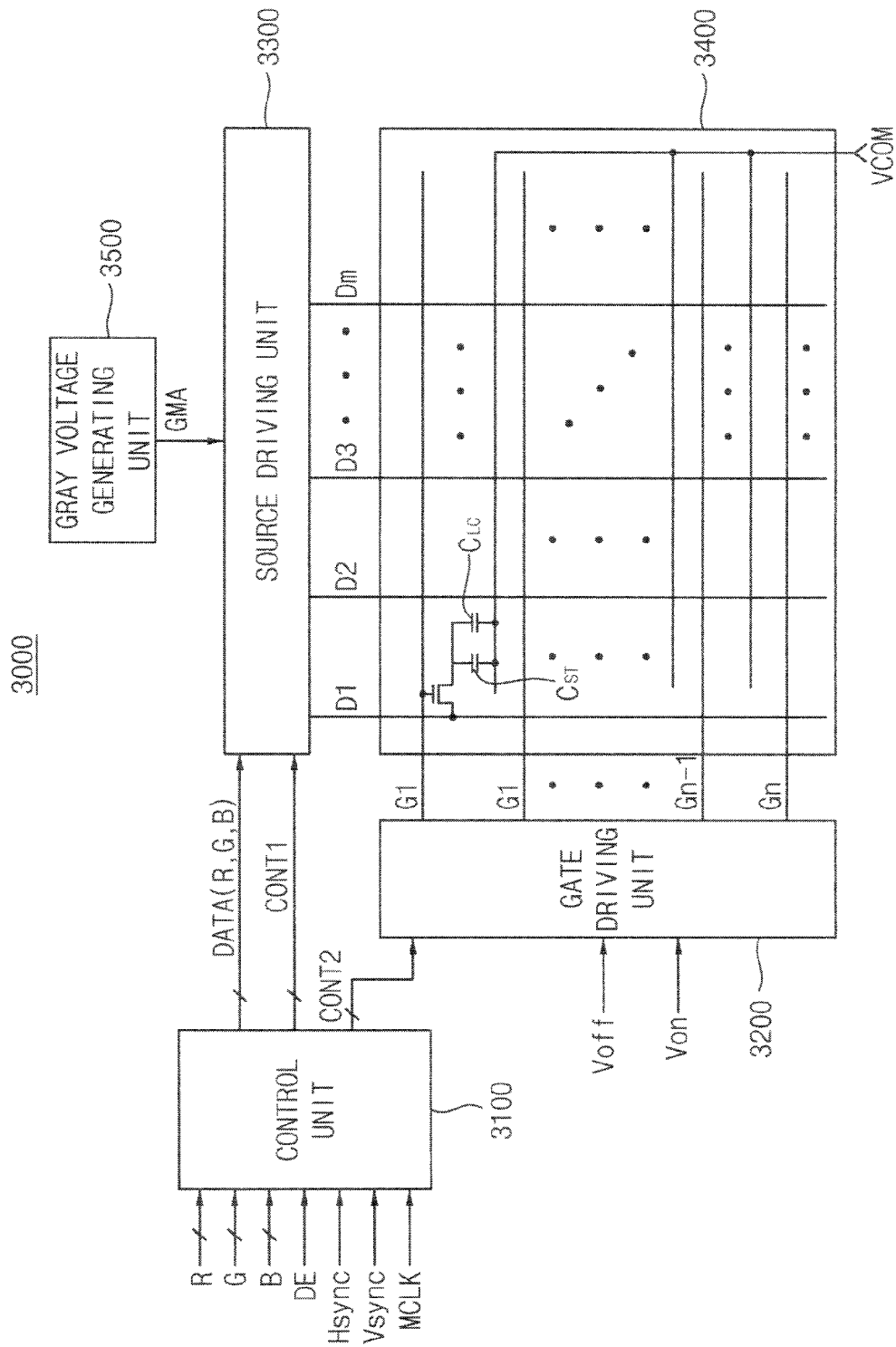
FIG. 17 is a block diagram illustrating an LCD device that includes a source driving circuit according to example embodiments.

FIG. 17 is a block diagram illustrating a liquid crystal display (LCD) device 3000 that includes a source driving circuit according to example embodiments.

Referring to the example of FIG. 17, the LCD device 3000 includes a control unit 3100, a gate driving unit 3200, a source driving unit 3300, a liquid crystal panel 3400, and a gray voltage generating unit 3500.

The liquid crystal panel 3400 includes TFTs located at each intersection of the matrix. The TFT has a source receiving a source signal (also called a "data signal") and a gate receiving a gate signal (also called a "scan signal"). A storage capacitor CST and a liquid crystal capacitor CLC are connected between a drain of the TFT and a common voltage VCOM. The liquid crystal panel 3400 receives the gate signals through gate lines G1 to Gn, and the source signals through source lines D1 to Dm, respectively. The gate driving unit 3200 produces the gate signals by combining an on-voltage Von and an off-voltage Voff, and applies the gate signals to the gate lines G1 to Gn.

The gray voltage generating unit 3500 generates positive and negative gray scale voltages GMA associated with the brightness of the LCD device.

The source driving unit 3300 performs a digital-to-analog (D/A) conversion on data DATA received from the control unit 3100 by using the gray scale voltages GMA output from the gray voltage generating unit 3500, and applies the converted data to the source lines D1 to Dm.

The control unit 3100 receives RGB video signals R, G and B and control signals, such as a vertical sync signal Vsync, a horizontal sync signal Hsync, a main clock signal MCLK, a data enable signal DE, and so on. The controller 100 generates source control signals CONT1 and gate control signals CONT2 based on the control signals, and properly processes the RGB video signals R, G and B so as to meet operation conditions of the liquid crystal panel 3400. Then, the control unit 3100 transmits the gate control signals CONT2 to the gate driving unit 3200, and transmits the source control signals CONT1 and the video signals DATA (R, G, B) to the source driving unit 3300.

The gate driving unit 3200 and the source driving unit 3300 include a plurality of gate drive integrated circuits (IC) (not shown) and a plurality of source drive ICs (not shown), respectively. The data DATA determines a gray level with respect to each pixel. The source driving unit 3300 applies the source signals to the source lines arranged on the liquid crystal panel 3400, and the gate driving unit 3200 applies the gate signals to the gate lines arranged on the liquid crystal panel 3400.

The source driving unit 3300 included in the LCD device 3000 may have the same structure of a source driving circuit 2000 of FIG. 16. Therefore, the LCD device 3000 includes a digital-to-analog converter according to one or more of the example embodiments described above. The digital-to-analog converter included in the LCD device 3000 may modulate a drain current and generate an output signal having an offset to perform digital-to-analog conversion. Further, the digital-to-analog converter included in the LCD device 3000 performs digital-to-analog conversion on upper bits of a digital input signal using the first digital-to-analog converter having a resistor string, and performs digital-to-analog conversion on lower bits of a digital input signal using the second digital-to-analog converter having a current-mode digital-to-analog converter.

In the above, a digital-to-analog converter, a source driving circuit including the digital-to-analog converter, and an LCD device having the source driving circuit have been described. Also, the inventive concepts described herein may be applied to other types of display devices, such as plasma display panels (PDP) and organic light emitting diode (OLED) devices.

While the example embodiments of the present invention and its advantages have been described in detail, it should be understood that various changes, substitutions and alterations can be made herein without departing from the scope of the invention as defined by appended claims.

What is claimed is:

1. A digital-to-analog converter comprising:
a voltage-to-current converter configured to generate a first current signal proportional to a difference between a first voltage signal having a first voltage level and a second voltage signal having a second voltage level;
a current-mode digital-to-analog converter configured to generate a second current signal corresponding to a digital input signal in response to the digital input signal and the first current signal; and
an operational amplifier configured to modulate a drain current in response to the second current signal and the second voltage signal and to generate an output signal including an offset.

2. The digital-to-analog converter of claim 1, wherein the digital input signal is an M-bit data signal, and the digital-to-analog converter is configured to generate $2^M$ analog input signals, where M is an integer.

3. The digital-to-analog converter of claim 1, wherein the current-mode digital-to-analog converter is configured to generate $2^M$ current signals and output a current signal corresponding to the digital input signal, where M is an integer.

4. The digital-to-analog converter of claim 1, wherein the operational amplifier includes a differential input unit, and wherein the voltage-to-current converter is an amplifier of a same circuit structure as the differential input unit.

5. The digital-to-analog converter of claim 1, wherein the operational amplifier comprises:
a differential input unit configured to modulate a drain current using the second current signal and to amplify a difference between the second voltage signal and the output voltage; and
a gain unit configured to amplify an output signal of the differential input unit to generate the output voltage.

6. A digital-to-analog converter comprising:
a first digital-to-analog converter configured to perform digital-to-analog conversion on upper bits of a digital input signal to generate a first voltage signal having a first voltage level and a second voltage signal having a second voltage level; and
a second digital-to-analog converter configured to generate a first current signal proportional to a difference between a magnitude of the first voltage signal and a magnitude of the second voltage signal, configured to generate a second current signal corresponding to the digital input signal in response to lower bits of the digital input signal and the first current signal, and configured to modulate a drain current in response to the second current signal and the second voltage signal and generate an output voltage including an offset.

7. The digital-to-analog converter of claim 6, wherein the first digital-to-analog converter includes a resistor string for generating voltage signals corresponding to decoded values of the upper bits of the digital input signal.

8. The digital-to-analog converter of claim 6, wherein the second digital-to-analog converter comprises:

a voltage-to-current converter configured to generate the first current signal;

a current-mode digital-to-analog converter configured to generate the second current signal; and an operational amplifier configured to modulate a drain current in response to the second current signal and the second voltage signal and to generate the output signal including the offset.

9. A display device comprising:

a shift register configured to generate a pulse signal based on a clock signal and an input/output control signal;

a data latch circuit configured to latch data according to a shift order of the shift register and to output the data as digital input signals in response to a load signal;

a digital-to-analog converter configured to generate source signals corresponding to the digital input signals using a gray voltage; and a panel configured to operate in response to the source signals, the digital-to-analog converter comprising:

a first digital-to-analog converter configured to perform digital-to-analog conversion on upper bits of a digital input signal to generate a first voltage signal having a first voltage level and a second voltage signal having a second voltage level; and a second digital-to-analog converter configured to generate a first current signal proportional to a difference between a magnitude of the first voltage signal and a magnitude of the second voltage signal, configured to generate a second current signal corresponding to the digital input signal in response to lower bits of the digital input signal and the first current signal, and configured to modulate a drain current in response to the second current signal and the second voltage signal and generate an output signal including an offset.

10. The display device of claim 9, wherein the first digital-to-analog converter includes a resistor string for generating voltage signals corresponding to decoded values of the upper bits of the digital input signal.

11. The display device of claim 9, wherein the second digital-to-analog converter comprises:

a voltage-to-current converter configured to generate the first current signal;

a current-mode digital-to-analog converter configured to generate the second current signal; and an operational amplifier configured to modulate a drain current in response to the second current signal and the second voltage signal and to generate the output signal including the offset.

\* \* \* \* \*